(12) United States Patent
Chiang et al.

(10) Patent No.: US 8,778,491 B2
(45) Date of Patent: Jul. 15, 2014

(54) COATED ARTICLE AND METHOD FOR MANUFACTURING SAME

(75) Inventors: Chwan-Hwa Chiang, New Taipei (TW); Jia-Lin Chen, Shenzhen (CN); Yi-Jun Huang, Shenzhen (CN); Hai-Bo Pan, Shenzhen (CN); Xu Li, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 205 days.

(21) Appl. No.: 13/226,657

(22) Filed: Sep. 7, 2011

(65) Prior Publication Data

US 2012/0251838 A1  Oct. 4, 2012

(30) Foreign Application Priority Data

Mar. 30, 2011  (CN) .......................... 2011 1 0077935

(51) Int. Cl.
*B32B 17/06* (2006.01)

(52) U.S. Cl.
USPC ........... 428/336; 428/457; 428/469; 428/472; 428/697; 428/698; 428/699

(58) Field of Classification Search
USPC .......... 428/336, 457, 469, 472, 697, 698, 699
See application file for complete search history.

(56) References Cited

U.S. PATENT DOCUMENTS

| 6,558,822 B2 * | 5/2003 | Nagasaka et al. ............. 428/699 |
| 6,617,057 B2 * | 9/2003 | Gorokhovsky et al. ....... 428/698 |
| 6,988,318 B2 * | 1/2006 | Buchtmann et al. .......... 428/457 |
| 7,939,172 B2 * | 5/2011 | Gorokhovsky et al. ....... 428/336 |

FOREIGN PATENT DOCUMENTS

EP          603486    * 12/1995
JP       11-152583    *  6/1999

* cited by examiner

*Primary Examiner* — Archene Turner
(74) *Attorney, Agent, or Firm* — Novak Druce Connolly Bove + Quigg LLP

(57) ABSTRACT

A coated article is described. The coated article includes a substrate, a titanium bonding layer, a titanium-chromium alloy transition layer, and a titanium-chromium-nitrogen hard layer formed thereon, and in that order. The titanium bonding layer is a titanium layer. The titanium-chromium alloy transition layer is a titanium-chromium alloy layer. The titanium-chromium-nitrogen hard layer is a titanium-chromium-nitrogen layer. The titanium bonding layer, titanium-chromium alloy transition layer, and the titanium-chromium-nitrogen hard layer are formed by ion beam assisted sputtering.

5 Claims, 2 Drawing Sheets

COATED ARTICLE AND METHOD FOR MANUFACTURING SAME

BACKGROUND

1. Technical Field

The present disclosure relates to an article coated with a hard coating, and method for manufacturing the article.

2. Description of Related Art

Physical vapor deposition (PVD) can be used to form a coating on metal bases of cutting tools or molds. Materials for PVD coating need to have excellent hardness and abrasion resistance. Titanium nitride (TiN) and Titanium-aluminum nitride (TiAlN) are typically used, but are not always resistant enough to abrasion to satisfy demands.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
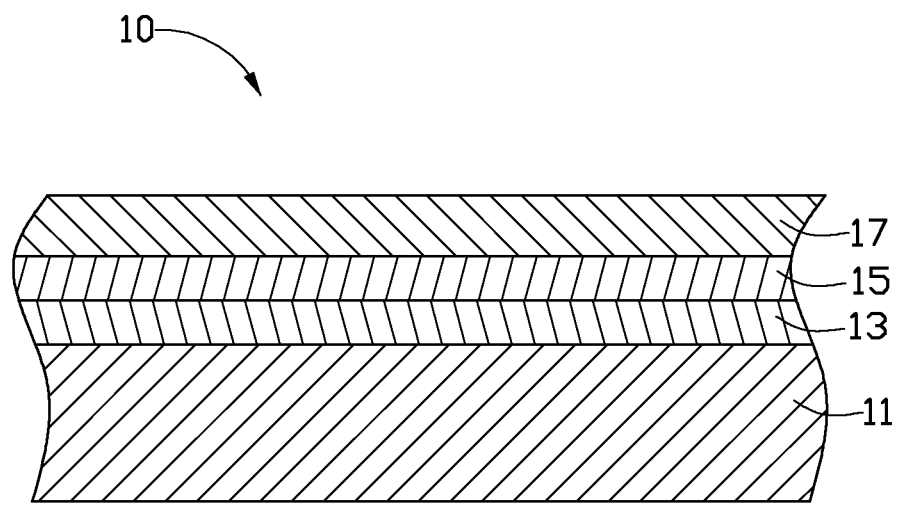
FIG. 1 is a cross-sectional view of an exemplary embodiment of a coated article.
Figure 2:
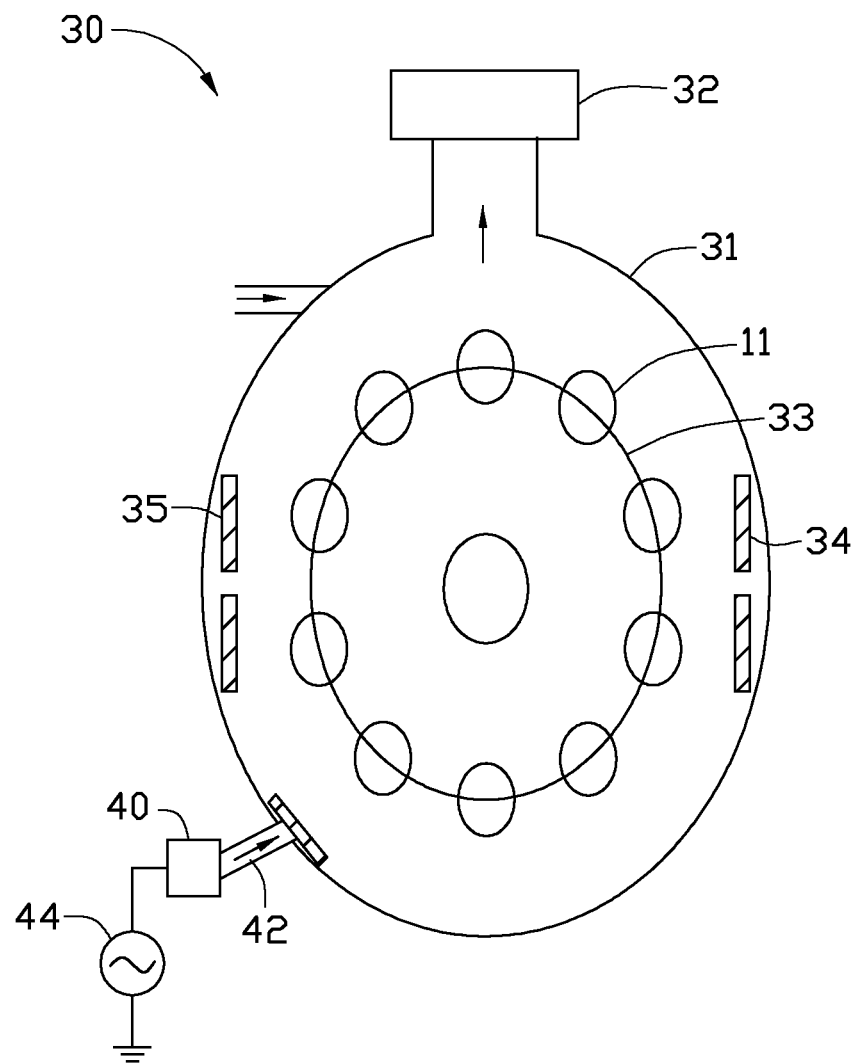
FIG. 2 is a schematic view of an ion assisted sputtering machine for manufacturing the coated article in FIG. 1.

FIG. 1 shows a coated article 10 according to an exemplary embodiment. The coated article 10 includes a substrate 11 having a titanium boding layer 13, a titanium-chromium alloy transition layer 15, and a titanium-chromium-nitrogen hard layer 17 formed thereon, and in that order.

The substrate 11 may be made of metal, such as high speed steel, hard alloy, stainless steel, titanium alloy, magnesium alloy, or aluminum alloy. The substrate 11 may also be made of ceramic or glass.

The titanium bonding layer 13 is a titanium (Ti) layer. The thickness of the titanium bonding layer 13 may be about 0.1 μm-0.4 μm. The titanium bonding layer 13 strengthens the bond between the titanium-chromium alloy transition layer 15 and the substrate 11.

The titanium-chromium alloy transition layer 15 is a titanium-chromium (TiCr) alloy layer. Within the titanium-chromium alloy transition layer 15, the titanium may have an atomic percentage of about 30%-40%, and the chromium may have an atomic percentage of about 60%-70%. The thickness of the titanium-chromium alloy transition layer 15 may be about 0.1 μm-0.4 μm.

The titanium-chromium-nitrogen hard layer 17 is a titanium-chromium-nitrogen (TiCrN) layer. Within the titanium-chromium-nitrogen hard layer 17, the titanium may have an atomic percentage of about 25.6%-37.0%, the chromium may have an atomic percentage of about 51.7%-67.6%, and the nitrogen may have an atomic percentage of about 5.4%-13.8%. The thickness of the titanium-chromium-nitrogen hard layer 17 may be about 1.3 μm-1.7 μm.

The titanium bonding layer 13, titanium-chromium alloy transition layer 15, and titanium-chromium-nitrogen hard layer 17 may be formed by an ion beam assisted sputtering process. The coated article 10 may be a cutting tool, a mold, a precision measuring tool, or a device housing.

An exemplary method for manufacturing the coated article 10 may include at least the following steps.

The substrate 11 is provided.

The substrate 11 may be pretreated by ultrasonic cleaning, to remove impurities such as grease or dirt from the substrate 11.

Referring to FIG. 3, an ion beam assisted sputtering machine 30 is provided. The ion assisted sputtering machine 30 includes a vacuum chamber 31 and a vacuum pump 32 connected to the vacuum chamber 31. The vacuum pump 32 is used to evacuate the vacuum chamber 31. A rotating bracket 33, at least one titanium target 34, and at least one chromium target 35 are set in the vacuum chamber 31. The machine 30 further includes an ion source 40 for generating ion beams and an ion passage 42 connecting through the ion source 40 and the vacuum chamber 31. The ion source 40 is coupled with a power source 44. The rotating bracket 33 rotates the substrate 11 in the vacuum chamber 31 relative to the titanium target 34 and the chromium target 35. The ion beams created by the ion source 40 enter the vacuum chamber 31 via the ion passage 42.

The titanium bonding layer 13 is formed on the substrate 11 by ion beam assisted sputtering. The substrate 11 is held on the rotating bracket 33. The speed of the rotating bracket 33 is between about 1 revolutions per minute (rpm) and about 5 rpm. The vacuum chamber 31 is evacuated to maintain a vacuum level of about $6.0 \times 10^{-3}$ Pa-$9.0 \times 10^{-2}$ Pa. The temperature in the vacuum chamber 31 is maintained at about 150° C.-250° C. Argon is fed into the vacuum chamber 31 as a sputtering gas, to create an internal pressure of about 0.3 Pa-0.5 Pa. A processing gas, such as argon is fed into the ion source 40 to generate ion beams. About 3.8 kW-4.2 kW of power is applied to the at least one titanium target 34, depositing the titanium bonding layer 13. The ion beams bombard the substrate 11 during the deposition of the titanium bonding layer 13. The ion beams may be generated by controlling the power of the power source 44 in a range of about 1 kW-1.5 kW. Deposition of the titanium bonding layer 13 may take about 5 minutes (min)-10 min.

In the exemplary embodiment, during the deposition of the titanium bonding layer 13, the speed of the rotating bracket 33 is about 3 rpm. The vacuum chamber 31 maintains a vacuum level of about $8.0 \times 10^{-3}$ Pa. The argon creates an internal pressure of about 0.4 Pa. An intermediate frequency power of about 4 kW is applied to the titanium target 34. Deposition of the titanium bonding layer 13 takes about 10 min.

The titanium-chromium alloy transition layer 15 is then formed on the titanium bonding layer 13 by ion beam assisted sputtering. Ion beam assisted sputtering the titanium-chromium alloy transition layer 15 is implemented in the vacuum chamber 30. The speed of the rotating bracket 33 is between about 1 revolutions per minute (rpm) and about 5 rpm. The vacuum chamber 31 maintains a vacuum level of about $6.0 \times 10^{-3}$ Pa-$9.0 \times 10^{-2}$ Pa. The temperature in the vacuum chamber 31 is maintained at about 150° C.-250° C. Argon is fed into the vacuum chamber 31 as a sputtering gas, to create an internal pressure of about 0.3 Pa-0.5 Pa. A processing gas, such as argon is fed into the ion source 40 to generate ion beams. About 3.8 kW-4.2 kW of power is applied to both the at least one titanium target 34 and the at least one chromium target 35, depositing the titanium-chromium alloy transition layer 15. The ion beams bombard the substrate 11 with the titanium bonding layer 13 during the deposition of the titanium-chromium alloy transition layer 15. The ion beams may be generated by controlling the power of the power source 44 in a range of about 1 kW-1.5 kW. Deposition of the titanium-chromium alloy transition layer 15 may take about 5 minutes (min)-10 min.

In the exemplary embodiment, during the deposition of the titanium-chromium alloy transition layer 15, an intermediate frequency power of about 4 kW of is applied to the titanium target 34. A DC power of about 4 kW of is applied to the chromium target 35. Deposition of the titanium-chromium alloy transition layer 15 takes about 10 min.

The titanium-chromium-nitrogen hard layer 17 is next formed on the titanium-chromium alloy transition layer 15 by ion beam assisted sputtering. Ion beam assisted sputtering the titanium-chromium-nitrogen hard layer 17 is implemented in the vacuum chamber 30. The speed of the rotating bracket 33 is between about 1 revolutions per minute (rpm) and about 5 rpm. The vacuum chamber 31 maintains a vacuum level of about $6.0 \times 10^{-3}$ Pa-$9.0 \times 10^{-2}$ Pa. The temperature in the vacuum chamber 31 is maintained at about 150° C.-250° C. Argon and nitrogen are simultaneously fed into the vacuum chamber 31, with the argon acting as a sputtering gas and the nitrogen acting as a reaction gas. Argon creates a pressure of about 0.3 Pa-0.5 Pa in the vacuum chamber 31. The ratio of pressure created by argon and pressure created by nitrogen in the vacuum chamber 31 is between about 1.5 and about 2.0. Argon and nitrogen as processing gases are fed into the ion source 40 to generate ion beams. About 3.8 kW-4.2 kW of power is applied to both the at least one titanium target 34 and the at least one chromium target 35, which in combination with the ionize nitrogen become deposited as the titanium-chromium-nitrogen hard layer 17. The ion beams bombard the substrate 11 with the titanium bonding layer 13 and the titanium-chromium alloy transition layer 15 during the deposition of the titanium-chromium alloy transition layer 15. The ion beams may be generated by controlling the power of the power source 44 in a range of about 1 kW-1.5 kW. Deposition of the titanium-chromium-nitrogen hard layer 17 may take about 30 minutes (min)-50 min.

In the exemplary embodiment, during the deposition of the titanium-chromium-nitrogen hard layer 17, an intermediate frequency power of about 4 kW is applied to the titanium target 34. A DC power of about 4 kW is applied to the chromium target 35. Deposition of the titanium-chromium-nitrogen hard layer 17 takes about 40 min.

The coated article 10 has a surface micro-hardness of about 600 $HV_{0.025}$-700 $HV_{0.025}$. The bonding force of the layers of the coated article 10 is about 70 N.

During the deposition of the titanium bonding layer 13, titanium-chromium alloy transition layer 15, and titanium-chromium-nitrogen hard layer 17, ion beams bombard the substrate 11, thereby increasing the density of the titanium bonding layer 13, titanium-chromium alloy transition layer 15, and titanium-chromium-nitrogen hard layer 17. Thus, the abrasion resistance of the coated article 10 can be improved. Comparing with a sputtering process without the presence of the ion beams, the present method requires a shorter time. Furthermore, to achieve the same hardness, a layer created by the present method is thinner than a layer created by a sputtering process without the presence of the ion beams.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate;
   a titanium bonding layer formed on the substrate;
   a titanium-chromium alloy transition layer formed on the titanium bonding layer; and
   a titanium-chromium-nitrogen hard layer formed on the titanium-chromium alloy transition layer;
   wherein within the titanium-chromium-nitrogen hard layer, the titanium has an atomic percentage of about 25.6%-37.0%, the chromium has an atomic percentage of about 51.7%-67.6%, and the nitrogen has an atomic percentage of about 5.4%-13.8%, the titanium bonding layer, the titanium-chromium alloy transition layer, and the titanium-chromium-nitrogen hard layer are formed by ion beam assisted sputtering processes during which ion beams bombard the substrate, the coated article has a surface micro-hardness of about 600 $HV_{0.025}$-700 $HV_{0.025}$.

2. The coated article as claimed in claim 1, wherein within the titanium-chromium alloy transition layer, the titanium has an atomic percentage of about 30%-40%; the chromium has an atomic percentage of about 60%-70%.

3. The coated article as claimed in claim 1, wherein the titanium bonding layer and the titanium-chromium alloy transition layer each has a thickness of about 0.1 μm-0.4 μm.

4. The coated article as claimed in claim 1, wherein the titanium-chromium-nitrogen hard layer has a thickness of about 1.3 μm-1.7 μm.

5. The coated article as claimed in claim 1, wherein the substrate is made of a material selected from the group consisting of high speed steel, hard alloy, stainless steel, titanium alloy, magnesium alloy, aluminum alloy, ceramic and glass.

* * * * *